Feb. 8, 1966 SATOSHI SHIMADA ETAL 3,234,479
SERIES ENERGIZED TRANSISTOR AMPLIFIER HAVING TEMPERATURE COMPENSATION
Filed Oct. 5, 1962
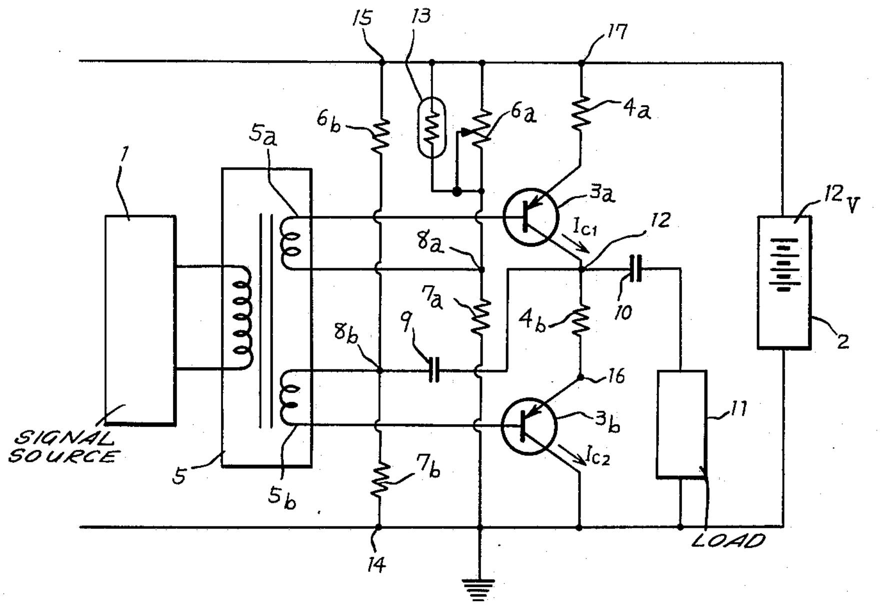
Inventors
Satoshi Shimada
Toshihiro Fujimoto
by Hill, Sherman, Meroni, Gross & Simpson
Attys 3,234,479

SERIES ENERGIZED TRANSISTOR AMPLIFIER HAVING TEMPERATURE COMPENSATION

Satoshi Shimada, Ohta-ku, Tokyo, and Toshihiro Fujimoto, Funabashi-shi, Chiba-ken, Japan, assignors to Sony Corporation, Tokyo, Japan, a corporation of Japan Filed Oct. 5, 1962, Ser. No. 228,652
Claims priority, application Japan, Oct. 7, 1961, 36/50,720
4 Claims. (Cl. 330—18)

This invention relates to a series feed type transistor amplifier and more particularly to a temperature compensation circuit of such a series feed type transistor amplifier.

One object of this invention is to provide a temperature compensation circuit of a series feed type transistor amplifier which is simple in connection and effective in operation.

Another object of this invention is to provide a temperature compensation circuit of a series feed type transistor amplifier in which a comparatively minor number of circuit elements can be used with easy adjustment and stable operation.

A further object of this invention is to provide a temperature compensation circuit of a series feed type transistor amplifier in which only one temperature compensation element is connected to either one transistor circuit of two transistor circuits connected in parallel so that all the transistors are prevented from being affected by the temperature variation.

A still further object of this invention is to provide a single ended push-pull transistor amplifier output circuit in which a pair of transistors are connected in series to each other and signals are supplied respectively to them to be amplified in the push-pull type and a load is connected to the connecting point of the two transistors.

Other objects, features and advantages of this invention will become more apparent from the following description taken in conjunction with the accompanying drawing in which, The single figure is a circuit diagram illustrating an embodiment of a temperature compensation circuit of a series feed type transistor amplifier according to this invention.

Referring now to the drawing, an example of the temperature compensating circuit of this invention will hereinafter be explained. 1 is a signal source and 2 shows a direct current power source. To the both ends of this direct current power source 2 is connected a series circuit of transistors 3*a* and 3*b* of the same conductivity type, for example PNP type which are connected in series to each other. That is, a series circuit of an emitter resistor 4*a*—the emitter electrode of the transistor 3*a*—the collector electrode thereof—an emitter resistor 4*b*—the emitter electrode of the transistor 3*b*—the collector electrode thereof is connected to the both ends of the power source 2. To the output side of the signal source 1 is connected the primary coil of a transformer 5 which is provided with a pair of secondary coils 5*a* and 5*b*. A series circuit of voltage dividing resistors 6*a* and 7*a* is connected to the power source 2 and their connecting point 8*a* is connected to the base of the transistor 3*a* through the secondary coil 5*a* of the transformer 5. Similarly, a series circuit of voltage dividing resistors 6*b* and 7*b* is connected to the power source 2 and their connecting point 8*b* is connected to the base of the transistor 3*b* through the secondary coil 5*b*. Thus, base bias voltages are applied respectively to the transistors 3*a* and 3*b*. These circuits are referred to as base bias circuits.

Furthermore, signals are respectively supplied across the base and emitter of the transistor 3*a* and across the base and emitter of the transistor 3*b* through a capacitor 9 inserted between the connecting point 8*b* and the connecting point 12 of the collector of the transistor 3*a* and the emitter resistor 4*b*. A load 11, for example, a speaker is connected across the connecting point 12 and a reference point through a direct current blocking capacitor 10.

With such a connection of the circuit, a voltage of approximately ½ of the voltage of the power source 2 is applied as an operating voltage to the two transistors 3*a* and 3*b* and signals are supplied from the signal source 1 and then they are applied to the load 11 after amplified in the push-pull manner. This kind of the circuit is called a series feed type single ended push-pull output circuit.

In such an output circuit, the transistors 3*a* and 3*b* are affected by temperature and so their characteristics may be changed accordingly, and hence it is desired to do the temperature compensation of the transistors 3*a* and 3*b* respectively. To accomplish this, it is generally sufficient to connect a temperature compensating element to both of the base bias circuits of the transistors.

However, we paid our attention to the fact that when carrying out the temperature compensation of transistors the variation due to the temperature of one transistor exerts influence on the other transistor because the two transistors are connected in series to each other. That is, we found that by connecting a temperature compensating element, for instance a thermistor 13 to the base bias circuit of one transistor, practical objects could be sufficiently accomplished without respectively connecting temperature compensating elements to the both transistors as in the conventional method.

That is, with the connection of a temperature compensating element to the base bias circuit of one transistor, the temperature compensation of the other transistor can be effected simultaneously. The collector current $I_{c2}$ of the transistor 3*b* is under control of the collector current $I_{c1}$ of the transistor 3*a* and the latter $I_{c1}$ is controlled by the base bias voltage of the transistor 3*a*. Therefore, both the currents $I_{c1}$ and $I_{c2}$ are controlled under the same temperature compensation. Even if the unbalanced ratio, namely, $I_{c2}/I_{c1}$ between the two transistors becomes a little worse by the connection of a temperature compensating element to one transistor circuit alone, its influence on the distortion factor is, in fact, out of the question in almost all cases. In the case where the value of a plurality of the voltage dividing resistors 6*b* and 7*b* connected to the base bias circuit of the transistor 3*b* without having the temperature compensating element connected thereto is increased, power consumption across terminals 14 and 15 can be made sufficiently small. The direct current resistance across terminals 16 and 17 serves as an emitter external resistor with respect to the transistor 3*b* and stable operation can be expected owing to the feedback effect.

Thus, the temperature compensation of two transistors can be performed simultaneously with one temperature compensating element and the adjustment can be simplified because the number of circuit elements is decreased.

A embodiment of this invention is as follows:

| | |
|---|---|
| Voltage dividing resistor: | |
| 6*b* | 1.2KΩ |
| 7*b* | 0.8KΩ |
| 6*a* | 75Ω |
| 7*a* | 1.2KΩ |
| Emitter resistors 4*a* and 4*b* | 18Ω |
| Capacitor 9 and D.C. suppressing capacitor 10 | 50μf. |
| Load 11 | 75Ω |

It will be apparent that many modifications and variations may be effected without departing from the scope of the novel concept of this invention.

What is claimed is:

1. A series energized transistor amplifier comprising
(a) a direct current source,
(b) a pair of transistors each having a base, an emitter, and a collector electrode,
(c) a series circuit including the emitter and collector of each transistor connected across said direct current source,
(d) input means including a pair of base bias circuits each connected across said direct current source and each connected to the base electrode of a respective one of said transistors,
(e) a load connected between a common connection point of said transistors and one side of said direct current source, and
(f) a temperature compensating element connected to only one of said base bias circuits whereby temperature compensations of said transistors can be simultaneously performed.

2. A series energized transistor amplifier as defined in claim 1 wherein each of said base bias circuits includes a voltage dividing circuit and a secondary coil of a transformer, each of said voltage dividing circuits includes at least two voltage dividing resistors, one end of one of said secondary coils being connected to the base electrode of one of said transistors and the other end of said one secondary coil being connected through one of said voltage dividing resistors to said direct current source, said temperature compensating element being connected in shunt with said one voltage dividing resistor.

3. A series energized transistor amplifier as defined in claim 2 wherein the resistance value of another of said voltage dividing resistors is substantially larger than that of said one voltage dividing resistor.

4. A series energized transistor amplifier as defined in claim 2 wherein each of said transistors is of the same conductivity type as the other.

References Cited by the Examiner

UNITED STATES PATENTS

| | | | |
|---|---|---|---|
| 2,955,257 | 10/1960 | Lindsay | 330—17 XR |
| 2,994,833 | 8/1961 | Cerofolini | 330—18 |

ROY LAKE, *Primary Examiner.*

NATHAN KAUFMAN, *Examiner.*